US007291445B2

(12) United States Patent
Ron et al.

(10) Patent No.: US 7,291,445 B2
(45) Date of Patent: Nov. 6, 2007

(54) SINGLE-COAT SELF-ORGANIZING MULTI-LAYERED PRINTING PLATE

(75) Inventors: Hannoch Ron, Kadima (IL); Murray Figov, Ra'anana (IL); Anna Sigalov, Natanya (IL)

(73) Assignee: Kodak IL, Ltd., Herzlia (IL)

( * ) Notice: Subject to any disclaimer, the term of this patent is extended or adjusted under 35 U.S.C. 154(b) by 217 days.

(21) Appl. No.: 10/521,098

(22) PCT Filed: Jul. 25, 2003

(86) PCT No.: PCT/IL03/00602

§ 371 (c)(1), (2), (4) Date: May 11, 2005

(87) PCT Pub. No.: WO2004/011259

PCT Pub. Date: Feb. 5, 2004

(65) Prior Publication Data

US 2005/0214548 A1 Sep. 29, 2005

Related U.S. Application Data

(60) Provisional application No. 60/399,127, filed on Jul. 30, 2002.

(51) Int. Cl.
*G03F 7/075* (2006.01)

(52) U.S. Cl. ...................... 430/302; 101/466; 101/467; 428/447; 428/532; 430/303

(58) Field of Classification Search ..................... None
See application file for complete search history.

(56) References Cited

U.S. PATENT DOCUMENTS

| | | | | |
|---|---|---|---|---|
| 5,353,705 | A * | 10/1994 | Lewis et al. | 101/453 |
| 5,704,291 | A * | 1/1998 | Lewis | 101/457 |
| 5,871,883 | A * | 2/1999 | Hirano et al. | 430/272.1 |
| 6,030,712 | A * | 2/2000 | Notsu et al. | 428/480 |
| 6,207,349 | B1 * | 3/2001 | Lewis | 430/302 |
| 6,477,966 | B1 | 11/2002 | Petryna | |
| 6,640,713 | B2 | 11/2003 | Landsman | |
| 2002/0146634 | A1 * | 10/2002 | Hong et al. | 430/166 |

FOREIGN PATENT DOCUMENTS

| | | | |
|---|---|---|---|
| DE | 2512038 | * | 12/1979 |
| EP | 456 336 A2 | * | 11/1991 |
| EP | 0 794 069 B1 | | 9/1997 |
| EP | 1 031 413 B1 | | 8/2000 |
| JP | 62-134289 | * | 6/1987 |
| JP | 10-26825 | * | 1/1998 |
| WO | WO 94/01280 | * | 1/1994 |
| WO | WO 98/31550 | | 7/1998 |

* cited by examiner

*Primary Examiner*—Marc S. Zimmer
(74) *Attorney, Agent, or Firm*—J. Lanny Tucker

(57) ABSTRACT

A single manufacturing pass for manufacturing a multilayered self-organized coating onto a substrate to provide all of the functions usually provided in multiple-pass coatings for manufacturing an infrared imageable offset lithographic printing plate; and a process whereby two or more polymeric materials that cannot usually co-exist in solution may be dissolved in suitably dilute solvent mixtures which, when coated onto a substrate and the solvents evaporated, deposit a continuous graduation of polymeric mixtures vertical to the substrate, caused by the self-assembly process.

24 Claims, No Drawings

SINGLE-COAT SELF-ORGANIZING MULTI-LAYERED PRINTING PLATE

CROSS-REFERENCE TO RELATED APPLICATIONS

The present application claims the benefit of the filing date of co-pending U.S. provisional application, Ser. No. 60/399,127 filed Jul. 30, 2002, entitled "SINGLE-COAT SELF-ORGANIZING MULTI-LAYERED PRINTING PLATE".

FIELD OF INVENTION

The invention relates to the field of offset lithographic printing plates the manufacturing and composition thereof.

BACKGROUND OF THE INVENTION

Offset lithographic printing has been based for many years on the use of imaged plates, where background non-printing areas are covered during the printing process with aqueous fount solution and the print areas on the plate are inked up with oleophilic inks which provide the printed matter on the paper or other types of substrate upon which the print is required. The aqueous fount provides an oleophobic surface to prevent inking of the non-image areas. Thus, the offset lithographic plate must be imaged in such a way as to provide areas which are hydrophilic and can be covered with fount (corresponding to areas of background on the final print) and areas which will not accept the fount and are therefore hydrophobic, which will then receive the ink for printing. The offset printing machine contains means of continuously supplying both ink and fount in order to produce multiple printing impressions. The supplies of ink and fount must be carefully controlled and balanced to produce good quality prints with no ink in the background.

In U.S. Pat. No. 3,511,178 Curtin described waterless printing, where instead of relying on the water to repel the ink, the background areas are coated with an oleophobic layer, so eliminating the need for fount and making control of the press easier. The material most widely used for the oleophobic layer has been polydimethyl siloxane (PDMS).

As described in the Curtin patent and in many subsequent patents on waterless printing, the imaging process involves selective removal of the silicone coating. The layer uncovered by the imaging process is ink receptive. The ink receptive layer is usually based on a polymeric layer. In an offset press, the ink supplied to the printing plate by the inking system will be rejected by the silicone layer and accepted by the areas where the silicone was removed.

In order to image the plate, the silicone can be selectively removed by methods such as spark erosion, thermal ablation and selective curing of layers underneath the silicone film, to alter the adhesion of the top silicone coating to the undercoat. Instances of these processes may be found in, GB 1,490,732, and U.S. Pat. Nos. 6,004,723 and 3,511,178. In the latter case, a chemical development process removes the PDMS from the uncured areas of the under-layer.

Apart from the properties of ink reception and ink repulsion, there are other important properties that the plate should have. Examples of these properties are high imaging sensitivity, good shelf life, sufficient robustness to withstand printing multiple impressions and chemical resistance to ink and cleaning materials. The full functionality of the plate is achieved by the use of materials which provide specific properties. For instance, chromophors or other materials which absorb radiation are used in the case of Ultra Violet (UV) or infrared (IR) imaging to absorb the appropriate radiant energy which is then used to form the selective image. Polymeric materials are used to bind the radiation materials and to provide bonding between the PDMS layer and the substrate.

It is important to emphasize that the positioning of the materials in the plate structure plays a major role in the plate performance. Most waterless plates have multiple coatings where, for example, the topcoat is oleophobic and does not include ink receptive materials; these are usually located in one of the under-layers. In plates imaged using thermal ablation, electromagnetic energy is transformed into thermal energy by absorption into material embedded in the plate. It is usual for a thermally insulating layer to be positioned between the substrate and the ablating layer if the substrate is highly thermally conductive, as for instance with aluminum. This reduces the dissipation of the thermal energy produced during imaging; such dissipation would make the plate less thermally sensitive. A thermally absorbing material which is instrumental in producing the image is usually located in one of the under-layers. In order to best achieve performance, multiplayer systems have been devised. U.S. Pat. No. 6,045,964 to Ellis, et al. provides an example of a waterless plate on an aluminum base utilizing 5 separate layers.

Thus, to meet the above requirements for optimal functionality of the printing plate, the accepted solution is layered structures, where different layers contribute different properties required for the functionality of the plate. The layered structure does not modify the silicone layer surface, and allocates the different materials to their appropriate places in the plate.

In industrial manufacturing, each of the layers of the offset printing plate is coated separately on a suitable coating line. Occupying a coating line is expensive. A significant part of the process of setting-up the coating machine and reaching constant coating conditions has to be done whilst running a web substrate and applying the coating materials. As a result, a significant amount of substrate, as well as coating material, is wasted. The more layers applied, the more material is wasted. Note that the waste is becoming more expensive the more layers are applied. In addition, adhesion between the coated layers is always an issue to be concerned about.

Several inventors have suggested incorporating all of the required materials for the formation of a waterless offset plate into one layer, where the substrate of the printing plate, polyester for example, serves as the ink-accepting layer. Nechiporenko and Markova in a paper published in 1979, "Direct Method of Producing Waterless Offset Plates by Controlled Laser Beam" "Preprint 15" International larigi Conference 1979, warned of the danger of attempting to incorporate dyes, pigments or other such materials into the top layer of the plate, as they found that it adversely affected the oleophobic properties of the silicone layer. Nevertheless, Landsman, in U.S. Pat. No. 6,477,955, claims a one-coat ablatable waterless plate and Lewis, in U.S. Pat. No. 5,339,737, describes a one-coat silicone layer waterless plate. No details of the press performance of such constructions are given and it would be likely from the comments of Nechiporenko et al. that this would be extremely limited.

U.S. Pat. No. 6,218,780 to Ben Horin et al. describes a one-coat system primarily for use on-press for a plateless application. This was based on a silicone emulsion where the infrared absorbing material is dispersed or dissolved in the aqueous phase. Such emulsions necessitate the use of low molecular weight polydimethyl siloxanes, which have limited robustness properties and consequently are only described for press run lengths of 5000 impressions. Although this may be sufficient for some applications, it does show a limitation that would indicate the limits of robustness.

SUMMARY OF THE INVENTION

The present invention provides, in a single manufacturing pass, a multilayered self-organized coating onto a substrate to provide all of the functions usually provided in multiple-pass coatings for manufacturing an infrared imageable offset lithographic printing plate.

The lithographic printing plate may be suitable for printing without fount (waterless) or with fount.

The substrate may be aluminum, or grained anodized aluminum, or aluminum treated with phosphoric acid, or polyester. The aluminum may be pre-coated with a thermally insulating organic coating.

The single coat self-organized multilayer may contain a poly dimethyl siloxane, which may have been polymerized by addition, or by the presence of catalysts and cross-linkers.

The single-coat self-organizing material may contain a hydrophilic polymer and/or an infrared absorbing dye or mixture of dyes.

The single-coat self-organized multilayer infra-red imageable material may comprise silicone polymers and non-silicone polymers.

The non-silicone polymer may be instrumental in incorporating the dye or dyes into the multilayer coating.

The non-silicone polymer may be nitrocellulose or a mixture of nitrocelluloses.

The non-silicone polymer is hydrophilic or oleophilic.

The non-silicone polymer may decompose exothermically during ablation imaging.

The non-silicone polymer may provide strong adhesion to the substrate.

Selective imaging by infra-red ablation of the single coat self-organized multilayer, may give oleophilic image areas formed by the surface of the substrate, and oleophobic non-image areas formed from unablated silicone, or oleophilic image areas formed by the non-silicone polymer-enriched surface directly attached to the substrate exposed by the image ablation process and oleophobic non-imaged areas formed from unablated silicone, or hydrophilic ablated (background) areas formed by the surface of the substrate, and oleophilic non-ablated (image) areas formed from unablated silicone, or hydrophilic ablated (background) areas formed by the non-silicone polymer-enriched surface directly attached to the substrate exposed by the ablation process and oleophilic non-ablated (image) areas formed from unablated silicone.

The present invention further provides a process whereby two or more polymeric materials that cannot usually co-exist in solution may be dissolved in suitably dilute solvent mixtures which, when coated onto a substrate and the solvents evaporated, deposit a continuous graduation of polymeric mixtures vertical to the substrate, caused by the self-assembly process.

The substrate may be aluminum, or grained anodized aluminum, or aluminum treated with phosphoric, acid, or polyester. The aluminum may be pre-coated with a thermally insulating organic coating.

The single coat self-organizing material may contain a poly dimethyl siloxane, which may be polymerized by addition or by the presence of catalysts and cross-linkers.

The single coat self-organizing material may contain a hydrophilic polymer.

The single coat self-organizing material contains an infra-red absorbing dye or mixture of dyes.

The single-coat self-organizing infra-red imageable material may comprises silicone polymers and non-silicone polymers.

The single coat self-organizing material may contain an infrared absorbing dye or mixture of dyes.

The non-silicone polymer may be instrumental in incorporating the dye or dyes into the single coat.

The non-silicone polymer may be nitrocellulose or a mixture of nitrocelluloses.

The non-silicone polymer is hydrophilic or oleophilic.

The non-silicone polymer may decompose exothermically during ablation imaging.

The non-silicone polymer may provide strong adhesion to the substrate.

The self-organizing infra-red material may be deposited from a mixture of at least two volatile organic solvents.

The single coat self-organizing material may additionally contain a poly dimethyl siloxane, said poly dimethyl siloxane soluble in at least one of said mixture solvents.

The self-organizing infra-red material may be deposited from a mixture of at least two volatile organic solvents, wherein the non-silicone polymer is soluble in at least one of said mixture solvents.

The solvent mixture may be diluted in order to permit all of the ingredients to remain in solution for at least 8 hours.

The single coat self-organizing material may contain a poly dimethyl siloxane and the infra-red absorbing dye or dyes are chosen so that they do not inhibit the curing of the poly dimethyl siloxane.

The method may additionally comprise the step of heating said applied self-organizing infra-red imageable material, wherein the material organizes itself into an infinite number of horizontal layers constituting a self-organized system.

The method may additionally comprise the step of heating said applied self-organizing infra-red imageable material, wherein the material organizes itself into an infinite number of horizontal layers constituting a self-organized system having a mixture rich in poly methyl siloxane on its surface and a mixture rich in non-silicone polymer in proximity to the substrate surface.

DETAILED DESCRIPTION OF PREFERRED EMBODIMENTS

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

It is known that silicone resins, when combined with other resins, tend to generate a coating with unique structural properties. It was shown by Eckberg R.; Rubinsztajn S.; Kreceski M.; Hatheway J. and Griswold R., in RadTech Conference Proceedings, Baltimore 2000, that upon incorporation of sufficient amounts of silicone resin into the coating mixture containing other resins, the dominant component present on the surface of the cured coating would be the silicone resin. The low surface energy of silicones is believed to be the driving force for the described phenomenon. Other materials such as fluorinated polymers show similar behavior.

The present inventors have found a means of applying the above phenomenon to the construction of a waterless offset printing plate which can be manufactured. When the coating mixture is applied on the suitable substrate and cured, a layer, which is enriched with silicone, is formed on the surface. In the composition of the cured coating, the amount of silicone is diminishing when moving from the surface towards the substrate, whilst the other resins become more prominent. In such a case, the adhesion between different layers is improved due to the natural inter-penetration between the layers. In fact, the system can be considered as an infinite number of layers formed by one coating process. The silicone part necessary for repulsion of the ink, as well as the non-silicone resins, which contribute to the adhesion of the coating to the substrate, among other properties, self-organize in the desired locations to produce a functional waterless offset printing plate.

Whilst both addition and condensation polydimethyl siloxanes may be useful in the invention, the preferred type is addition, as condensation siloxanes are more difficult to rapidly cure. Molecular weight and branched structure should be suitable to provide tough coatings. Whilst the exact nature of suitable materials is proprietary, examples of commercial materials that have been found of particular applicability are Wacker Dehesive 944 and Rhodia Silcolease 7420. Such materials must be used with recommended catalysts and cross-linkers. Siloxanes that are not suitable are the solventless ones and those which are supplied as water-based emulsions.

A second essential component is an infra-red absorbing dye. In order to keep the process of manufacturing simple, dyes are preferred although pigments may be used. They must be soluble in the solvent system to a sufficient extent as to provide sufficient infrared radiation during imaging. The distinction between pigments and dyes is here defined by the solubility of the dye in the solvent system and the insolubility of pigments. Insoluble pigments require means of dispersion, introducing an additional process with additional costs.

In addition, not all of the available infrared dyes are suitable. In order that an infrared dye can be used it must at least fulfill the following requirements:

(a) It must dissolve in the solvent system. Solubility can be determined by attempting to dissolve the dye in the solvent system that is used. If it does not dissolve, it cannot be used as a dye.

(b) It must not inhibit the curing of the silicone polymer. If the dye does dissolve in the solvent system to some extent, then the polydimethyl siloxane is added together with its required catalyst and cross-linker and the solution is then bar coated onto polyester film and dried at 140° C. for 4 minutes. If the film is tacky to touch, then in this test it is an indication that the dye is inhibiting the silicone curing and is therefore unsuitable for use. If a dry non-sticky film is produced, but the optimal physical properties such as adhesion, rub resistance and printing run length cannot be reached, the dye is inhibiting the curing of the silicone to a lesser extent, but nevertheless may not be used in the formulation. Comparative coatings without the dye can be made and tested for stickiness and other physical properties. Running the coatings as un-imaged printing plates on a printing press may give indication of optimum curing properties that can be obtained.

(c) It must not damage film formation properties. In some cases the introduction of dye into the systems results in a negative effect on the film properties, such as clarity, surface smoothness and lack of discontinuities, possibly due to change in the wetting properties (d) It must provide sufficient absorption at 830 nm It is important that sufficient absorption of electromagnetic radiation in the required wavelength can be obtained upon dissolving minimum quantities of dyes. This is because dyes are usually expensive. In addition, introduction of a very large amount of dyes may have a negative effect on the cured film properties.

Table I shows a list of dyes tested and their suitability. This is not an exhaustive list, but merely illustrates a means of choosing suitable dyes and the necessity of screening out unsuitable ones. Dyes that are insoluble cannot be used as solutions but may be useful as dispersions.

TABLE I

| Dye name | Solubility in system | Silicone inhibition | Maintains film formation properties | Absorption at 830 nm | Suitable |
|---|---|---|---|---|---|
| S 0712 | very low | | — | — | no |
| S 0229 | very low | | — | — | no |
| S 0325 | very low | | — | — | no |
| S 0260 | very low | | — | — | no |
| NK 5646 | low | no | — | — | no |
| NK 6271 | high | no | yes | sufficient | yes |
| NK 6270 | high | no | yes | sufficient | yes |
| NK 4489 | low | yes | — | — | no |
| NK 4680 | low | no | — | — | no |
| NK 5042 | high | no | no | sufficient | no |
| SDA 8080 | low | | — | — | no |
| SDA 4927 | low | | — | — | no |
| SDB 6592 | low | | — | — | no |
| SDB 7047 | low | | — | — | no |
| ADS 790 NH | high | no | yes | Not sufficient | no |
| Epolight V-63(new name 3063) | very low | yes | — | — | no |
| ADS 827MT | high | yes | — | — | no |
| ADS 830A | low | no | — | — | no |
| NK 2911 | very low | no | — | — | no |

Most dyes are proprietary and details of their chemical structure are commercial secrets. From information available, NK 6271, NK 4489, NK 2911 as well as ADS 790 NH are all cyanine dye. From the above table, it can be seen that only NK 6271 is completely soluble in the system and does not inhibit the silicone, does not damage film properties and gives sufficient absorption upon dissolving relatively low quantities in the formulation. On the other hand, NK 4489 is insoluble in the solvent mixtures used, but still inhibits silicone curing and is therefore unsuitable. NK2911 does not inhibit curing but is insoluble, and therefore not suitable. ADS 790 NH was found to be soluble in the system and did not inhibit curing. It maintained film properties but showed relatively low absorption of IR radiation at 830 nm and therefore is unsuitable.

A third essential ingredient is a binder polymer other than the silicone. The non-silicone binder polymer must be such that it automatically form part of the multilayer system. This combination results in a continuous distribution variation from a surface highly enriched with silicone, to a layer in contact with the substrate which is highly enriched with the non silicone polymer. This self-organizing process takes place during the evaporation of the solvents and is "frozen" as the multi-layer in the resulting dry film. The polymer should be one that after deposition can be cross-linked to give a solvent resistant film. Cross-linking of the polymer and the silicone must occur at approximately the same rate, otherwise part of the system may remain unpolymerised. The non-silicone polymer must be solvent soluble and must lend itself to formulation, to give the desired properties both in solution and in film form with the silicone/solvent system. Nitrocellulose has been found to be a most suitable example of a binder polymer. Polymers that have been found unsuitable, because of incompatibility or low adhesion or any of the other reasons of poor performance are, for instance, cellulosics other than nitrocellulose, e.g. cellulose proprionate, cellulose acetate-butyrate and hydroxy propyl cellulose.

Further additional essential ingredients are cross-linking resins. In preferred systems of this application, such resins should not need acid catalysts to react, as it has been found that acids cause phase-separation within the prepared solutions and often react with the dyes to cause precipitation. Even latent acid materials, such as amine salts of sulfonic acids that are commonly used for aminoplast catalysis, have been found to be unsuitable. Generally, it is preferable to use the cross-linking resin without a catalyst, although non-acid catalysts such as phosphate esters may be used.

Suitable materials may be selected from phenol-formaldehyde resins, (for example GPRI 7590) and amino-plasts. Although amines are purported to inhibit silicone cross-linking, it has been found that certain aminoplasts do not have a deleterious effect and can be used advantageously in the system.

In order to deposit the self-organizing material onto the substrate, all of the above ingredients must coexist in solution for a period during which industrial coating and drying can take place. This is preferably at least 8 hours. Thus, the PDMS and the polymer, which are essentially incompatible with each other, must be incorporated in the same solution. It may be considered that the obvious way to do this is to produce a water-based emulsion in which the silicone exists in a non-aqueous phase and suitable polymers are dissolved in the aqueous phase, so that each incompatible chemical may co-exist in one mixture. However, such systems do not result in the desired properties.

It has been found that in order to overcome incompatibility, the solvent mixtures must be sufficiently dilute. Solvent mixtures must be formulated to ensure appropriate compatibility and to give control over the rate of evaporation and stability that will ensure pot life for the solution during a period of several hours needed to conduct an industrial coating run. In addition, the self-organizing process will only follow a satisfactory path if, during deposition, the gradual phase separation occurs solely in a direction vertical to the surface of the substrate and not horizontally. Horizontal phase separation may be visible as islands of incompatible solid deposit within the coating. Coating thickness must be optimized. The creation of too thin a layer with the optimum silicone enrichment on the surface will decrease the print performance with respect to plate run length, as the thin layer wears away and the plate shows toning in the background, non-image areas.

Suitable substrates are polyester and both anodized/grained and un-anodized/un-grained aluminum. Where metal is used it is usually necessary to provide a thermally insulative under-coat to avoid heat dissipation during imaging and loss of sensitivity. In the present invention, it is possible to use the lower layers of the self-organizing coating to provide the thermal insulation. To do this, the coating must be deposited in a greater thickness than is needed for coating onto polyester. However, this does not exclude the use of an under-coat on the metal to provide further adhesion and higher image sensitivity, in which case the self-organized layer may be thinner.

The application of the self-assembling properties of silicone resins need not be restricted to waterless plates. It has been found that silicones with aromatic groups in the place of the methyl groups exhibit oleophilic properties. Thus, it is possible to apply a mixture of such silicones together with hydrophilic polymers, so that a one-coat system can be applied where, on imaging, the hydrophilic under-layer is exposed to form background areas and the oleophilic silicone on the topmost surface provides the ink receptive image.

Examples described below give the formation and use of an infrared ablatable polyester and aluminum based waterless offset lithographic printing plate using the single-coat self-organizing multi-layer principle described above. It can be used for computer-to-plate printing or direct imaging on a computer-to-press system. Imaging sensitivities referred to in the Examples are represented by the combination of drum speed and imaging intensities that are directly measurable on the imaging equipment used, rather than in calculated milli Joules. As all imaging in the examples was done at a drum speed of 100 r.p.m., it is possible to use the imaging energy intensity for comparison sensitivities. The energy sensitivity of a coating is defined here as being that which is sufficient to give good quality prints when the imaged plate is used on a waterless printing press. Energies lower than this sensitivity may give faint or incomplete prints. Higher energies may also give satisfactory print quality, but in the interests of efficiency and imaging speed, it is advantageous to work at a minimum energy that is satisfactory. Although it is generally the case that the imaging ablation removes all of the multilayer coating, revealing substrate that acts as the oleophilic image areas, partial ablation is not excluded as long as the remaining part of the layer is sufficiently rich in non-silicone polymer so as to exhibit good oleophilic properties. All quantities are in weights, including percentage solutions.

Coatings are deposited using wire wound rods, which deliver a specified wet coating thickness. Coating weights shown are those calculated by multiplying the thickness by the percentage weight of solids and assuming a density of the deposited solids of 1.

EXAMPLE I

This Example illustrates the point that it is possible to achieve good sensitivity for aluminum-based plates using the self-assembling multilayer system of this invention without the application of a primer as a thermally insulating layer.

Although it is not fully understood why this should happen, it has been found that layers with a higher total thickness and no primer give greater sensitivity than those of lower layer thickness.

Untreated aluminum was washed with methyl ethyl ketone (MEK), followed by phosphoric acid and then water. It was then dried. The following solutions were prepared:

Half-second nitrocellulose is dissolved in butyl acetate to give a 12% solution.

150-second nitrocellulose is dissolved in butyl acetate to give a 9% solution.

NK6271 IR dye is dissolved in butyl acetate to give a 0.76% solution.

| Solution U | |
|---|---|
| IR dye solution (see above) | 32.66 g |
| Diethylene glycol butyl ether | 1.15 g |
| Half-second nitrocellulose solution (see above) | 5.68 g |
| 150-second nitrocellulose solution (see above) | 0.89 g |
| Butylated amino resin | 0.99 g |

Solution U was made up by addition of the ingredients in the order as shown and thoroughly mixed together.

| Solution W | |
|---|---|
| Crosslinker V24 | 0.0467 g |
| Dehesive 944 | 5.463 g |
| Isopar H | 0.94 g |
| VM&P Naphta | 17.36 g |

Solution U was slowly poured into Solution W whilst stirring. After addition was completed, the mixture was stirred for 15 minutes and then 0.192 g of Catalyst OL was mixed in with stirring.

The solution was then bar coated onto the pre-treated aluminum to a wet coating thickness of 100 microns and air dried for 2.5 minutes followed by 1.5 minutes, up to a temperature of 140° C. and then held at that temperature for 5 minutes. The dry weight was 4.98 g.s.m. Note that this coating weight is greater than that in Example VI as well as of the total coating weight in Example III.

The finished aluminum-based printing plate was then imaged on a Lotem 400.

The machine drum was rotated at 100 r.p.m. and imaging was done at energy settings of 150, 200, 250 and 300 mW. Imaged areas were ablated by the heat generated by the absorption of laser energy by the IR dye in the coating.

The imaged plate was then washed with soapy water to remove ablated material and the plate mounted on a Heidelberg GTO printing press and used with printing ink. 650 impressions were printed. Based on the criteria previously described, sensitivity was assessed as corresponding to 200 mW-similar to the sensitivities of the polyester plate of Example II and the primed aluminum plate of Example III, both of which had lower coating weights than in this Example.

EXAMPLE II

The following formulation was prepared by mixing the non-silicone components with solvents in one container and the silicone resin and cross-linker with solvents in another container. All of the materials were then mixed together and then the silicone catalyst was added in and mixed to give the mixture ready for coating. All quantities are in grams.

Half-second nitrocellulose is dissolved in butyl acetate to give a 12% solution.

150-second nitrocellulose is dissolved in butyl acetate to give a 9% solution.

NK6271 IR dye is dissolved in butyl acetate to give a 0.66% solution.

| Solution A | |
|---|---|
| IR dye solution | 16.9 g |
| Half second nitrocellulose solution | 2.6 g. |
| 150 second nitrocellulose solution | 0.39 g |
| Butylated amino resin CCR764 | 0.44 g |

Solution A was made up by addition of the ingredients in the order as shown and thoroughly mixed together.

| Solution B | |
|---|---|
| Crosslinker V24 | 0.017 g |
| Dehesive 944 | 3.1 g |
| Isopar H | 0.15 g |
| VN&P Naphtha | 9.36 g |

Solution B was made up by addition of the ingredients in the order as shown and thoroughly mixed together.

Solution A was then slowly poured into Solution B whilst stirring. After addition was completed, the mixture was stirred for 15 minutes and then 0.107 g of the silicone catalyst OL was mixed in with stirring.

The solution was then bar coated onto 175-micron polyester to a wet coating thickness of 80 microns and air dried for 2.5 minutes followed by 1.5 minutes, up to a temperature of 140° C. and then held at that temperature for 5 minutes. The dry weight was 3.94 g.s.m.

The finished polyester-based printing plate was then imaged on a Lotem 400 at an energy corresponding to an intensity of 200 mW. Imaged areas were ablated by the heat generated by the absorption of laser energy by the IR dye in the coating.

The surface of the imaged plate was then washed with soapy water to remove ablated material and the plate mounted on a Heidelberg GTO printing press and used with waterless printing ink. It was possible to run 40,000 impressions of excellent print quality without detecting any print deterioration.

EXAMPLE III

This example describes an aluminum-based plate, which has an insulating primer coating below the self-organizing multi-layer, to optimize sensitivity at relatively low coating weights of the multi-layer.

| Primer Layer | |
|---|---|
| Butyl Acetate | 33.96 g |
| Half second nitrocellulose solution | 9.99 g. |
| 150 second nitrocellulose solution | 0.96 g |
| Diethylene glycol butyl ether | 1.105 |
| Butylated amino resin CCR764 | 0.627 g |

The primer mixture was made up by weighing out and mixing the ingredients in the order as shown above.

Untreated aluminum was washed with methyl ethyl ketone (MEK) followed by phosphoric acid and then water. It was then dried and bar coated with the primer solution to a wet thickness of 6 microns. The solvent was evaporated off and the coating dried at 140° C. for 4 minutes, to give a dry weight of 0.17 g.s.m.

| Solution C | | |
|---|---|---|
| IR dye solution (as in Example I, but 0.83% in butyl acetate) | 37.6 | g |
| Diethylene glycol butyl ether | 1.18 | g |
| Half-second nitrocellulose solution(see Example I) | 10.828 | g |
| 150-second nitrocellulose solution (see Ex. I) | 1.19 | g |
| Butylated amino resin CCR764 | 0.663 | g |

Solution C was made up by addition of the ingredients in the order as shown and thoroughly mixed together.

| Solution D | | |
|---|---|---|
| Crosslinker V24 | 0.0568 | g |
| Deehesive 944 | 6.9106 | g |
| Isopar H | 1.1 | g |
| VN&P Naphtha | 22.45 | g |

Solution C was then slowly poured into Solution D whilst stirring. After addition was completed, the mixture was stirred for 15 minutes and then 0.238 g of the silicone catalyst OL was mixed in with stirring.

The solution was then bar coated onto the primed aluminum to a wet coating thickness of 80 microns and air dried for 40 seconds, followed by a temperature of 140° C. held for 4 minutes. The dry weight was 3.97 g.s.m. Note that this weight was similar to that of Example II and although it was then imaged on a different machine, further tests on the plate showed that the plate had shown a similar sensitivity to that described in Example II.

Four finished aluminum-based printing plates were then mounted onto a 74 Karat Direct Imaging Printing Press and imaged. 200 high quality impressions were taken to show full color quality that can be obtained.

EXAMPLE IV

In order that the coating mixture may be used industrially, it is necessary that the pot life of the material be as long as possible. The example described below demonstrates that mixtures according to the present invention may be designed to be stable over a sufficient period of time as to make them coatable under commercial conditions.

| Solution E | | |
|---|---|---|
| IR dye solution (as in Example I, but 0.69% in butyl acetate) | 39.79 | g |
| Diethylene glycol butyl ether | 1.26 | g |
| Half second nitrocellulose solution (see Example I) | 6.30 | g |
| 150 second nitrocellulose solution (see Example I) | 0.96 | g |
| Butylated amino resin CCR 764 | 1.07 | g |

Solution E was made up by addition of the ingredients in the order as shown and thoroughly mixed together.

| Solution F | | |
|---|---|---|
| Crosslinker V24 | 0.0616 | g |
| Dehesive 944 | 7.284 | g |
| Isopar H | 1.26 | g |
| VM&P Naphtha | 23.02 | g |

Solution E was then slowly poured into solution F whilst stirring. The mixture was stirred for 15 minutes and then 0.246 g of the silicone catalyst OL was added.

The solution was then bar coated onto 175-micron polyester to a wet coating thickness of 100 microns and air dried for 2.5 minutes followed by 1.5 minutes, up to a temperature of 140° C. and then held at that temperature for 5 minutes. The dry weight was 4.93 g.s.m.

In order to test the pot life of the mixture, the solution was stirred continuously in an open vessel for 8 hours. The vessel was weighed together with its contents every 2 hours. In order to compensate for evaporation, the following solvent mixture was added. The total amount of solvent needed during 8 hours under ambient conditions (23° C.) was 13.47 g.

Dilution System:

| | |
|---|---|
| Butyl Acetate | 63% |
| VM&P Naphtha | 31% |
| Toluene | 6% |

The coating and drying procedure described above was repeated during the period up to 8 hours.

The finished polyester-based printing plates were then imaged on a Lotem 400 at an energy corresponding to 200 mW. Imaged areas were ablated by the heat generated by the absorption of laser energy by the IR dye in the coating.

The imaged plates coated from fresh mix, as well as those coated from 8 hours aged mix were then washed with soapy water to remove ablated material.

The plates were mounted on a Heidelberg GTO printing press and used with waterless printing ink. They ran 25,000 impressions and good quality stable printing results were obtained with no appreciable difference between plates coated at the beginning, end and middle of the pot-life test.

EXAMPLE V

This set of examples is a comparative one, to show instances where using catalysts of the non-silicone part of the mixture leads to separation of the solution in the vessel or separation during curing of the coating.

The entire mixture of Example IV in the state ready for coating (designated herein EXIV mixture) was made up and various catalysts were each added to the same amount of the material.

The solutions were then bar coated onto 175-micron polyester to a wet coating thickness of 80 microns and air dried for 2.5 minutes followed by 1.5 minutes, up to a temperature of 140° C. and then held at that temperature for 5 minutes. The dry weight was 3.95-3.99 g.s.m.

| Mixture EX-V-1 | |
|---|---|
| Mixture EX-IV | 20 g |
| Cycat 4045 | 0.01 g |

Cycat 4045 is an diisopropanolamine salt of para toluene sulphonic acid catalyst (35% in ethylene glycol). Phase separation can be seen on the surface of the dried coating.

| Mixture EX-V-2. | |
|---|---|
| Mixture EX-IV | 20 g |
| Cycat 4040 | 0.01 g |

Cycat 4040 is a strong sulphonic acid catalyst (40% in isopropanol). Phase separation can be seen on the surface of the dried coating.

| Mixture EX-V-3 | |
|---|---|
| Mixture EX-IV | 20 g |
| Anhydrous methane sulphonic acid solution (50.25% in butylacetate) | 0.074 g |

Easily visible phase separation occurred in the solution mixture.

| Mixture EX-V-4 | |
|---|---|
| Mixture EX-IV | 20 g |
| Titanium (IV) butoxide | 0.012 g |

Titanium (IV) butoxide, a titanium complex (99%) was applied. Easily visible phase separation occurred in the solution mixture.

EXAMPLE VI

This example is a comparative one to show that if the same coating weight is used on aluminum without a thermal insulating primer layer as is used in Example III, the sensitivity is reduced. Untreated aluminum was washed with MEK and then air-dried.

| Solution G | |
|---|---|
| NK6271 IR dye solution (0.69% in butyl acetate) | 39.77 g |
| Diethylene glycol butylether | 1.28 g |
| Half-second nitrocellulose solution (see Examp II) | 6.3 g |
| 150-second nitrocellulose solution (see Example I) | 0.96 g |
| Butylated aminoresin CCR 764 | 1.07 g |

Solution G was made up by addition of the ingredients in the order as shown and thoroughly mixed together.

| Solution H | |
|---|---|
| Crosslinker V24 | 0.0612 g |
| Dehesive 944 | 7.284 g |
| Isopar H | 1.27 g |
| VM&P Naphtha | 23.05 g |

Solution G was then slowly poured into Solution H whilst stirring. After addition was completed, the mixture was stirred for 15 minutes and then 0.25 g of the silicone catalyst OL was added in with stirring.

The solution was then bar coated onto the MEK washed aluminum to a wet coating thickness of 80 microns and air dried for 2.5 minutes followed by 2 minutes, up to a temperature of 140° C. and then held at that temperature for 5 minutes. The dry weight was 3.94 g.s.m.

The finished aluminum-based printing plate was then imaged on a Lotem 400 at energy intensities of 150, 300, 350 and 450 mW. Imaged areas were ablated by the heat generated by the absorption of laser energy by the IR dye in the coating.

The imaged plate was then washed with soapy water to remove ablated material and the plate mounted on a Heidelberg GTO printing press and used with printing ink. 150 impressions were printed and the prints examined to determine at what energy level satisfactory print quality was obtained. Prints imaged at energy intensities below 350 mW were incomplete. Sensitivity was estimated as being around 350 mW. The low sensitivity was attributed to the lack of thermal insulation below the multi-layered coating.

EXAMPLE VII

This is a comparative test with Example IV to show that using different binder polymers instead of nitrocellulose results in unsuitable mixtures.

EXAMPLE VII-1

| Solution J | |
|---|---|
| IR dye solution (as in Example I, but 0.85% in butyl acetate) | 16.02 g |
| Diethylene glycol butyl ether | 0.84 g |
| Cellulose propionate solution (see below) | 7.59 g |
| Butylated amino resin CCR 764 | 0.55 g |

Solution J was made up by addition of the ingredients in the order as shown and thoroughly mixed together.

| Solution K | |
|---|---|
| Crosslinker V24 | 0.031 g |
| Dehesive 944 | 3.642 g |
| Isopar H | 0.62 g |
| VM&P Naphtha | 11.0 g |

Solution J was slowly poured into Solution K whilst stirring. During the first few minutes of stirring, the material could be seen to separate out into two layers.

Cellulose Propionate Solution:

| | |
|---|---|
| Cellulose propionate (Ave. M.W. 15,000; CAS#9004482) | 1.4 g |
| Butyl Acetate | 28.6 g |
| Ethanol | 4.23 g |

Solution was prepared by addition ingredients and mixing up to dissolving.

EXAMPLE VII-2

| Solution L | |
|---|---|
| IR dye solution (as in Example I, but 0.9% in butyl acetate) | 15.11 g |
| Diethylene glycol butyl ether | 0.62 g |
| Cellulose acetate butyrate solution (3.5% in butyl acetate) | 7.64 g |
| Butylated amino resin CCR 764 | 0.57 g |

Cellulose acetate butyrate (18.5 wt. % acetyl and 31 wt. % butyryl content, average $M_n$ ca. 12,000; CAS#9004368) was used in this test.

| Solution M | |
|---|---|
| Crosslinker V24 | 0.031 g |
| Dehesive 944 | 3.642 g |
| Isopar H | 0.6 g |
| VM&P Naphtha | 11 g |

Solution L was poured into solution M whilst stirring. Material was mixed for 15 minutes and then 0.124 g of the catalyst OL was added.

The mixture was then bar coated onto 175-micron thickness polyester to a wet coating thickness of 80 microns and air dried for 2.5 minutes followed by 1.5 minutes,up to a temperature of 140° C. and then held at that temperature for 5 minutes. Dry coating weight was 4.05 g.s.m. Visual surface discontinuities were evident in the dry film.

EXAMPLE VII-3

| Solution N | |
|---|---|
| IR dye solution (as in Example I, but 0.91% in butyl acetate) | 15.07 g |
| Diethylene glycol butyl ether | 0.74 g |
| Hydroxypropylcellulose solution | 15.2 g |
| Butylated amino resin | 0.58 g |

| Solution P | |
|---|---|
| Crosslinker V24 | 0.031 g |
| Dehesive 944 | 3.642 g |
| Isopar H | 0.6 g |
| VM&P Naphtha | 11 g |

Solution N was slowly poured into solution P whilst stirring. During the first few minutes of stirring, the material could be seen to separate out into two layers Hydroxypropyl cellulose (Klucel GF PHARM of HERCULES) was used in the following solution.

| Hydroxypropyl cellulose solution: | |
|---|---|
| Hydroxypropylcellulose | 1.02 g |
| Butyl Acetate | 24.5 g |
| Ethanol | 24.51 g |

Mixing ingredients up to dissolving made up the solution

EXAMPLE VIII

| Solution Q | |
|---|---|
| IR dye NK 6271 solution (as in Example I but 0.83% in butyl acetate) | 16.64 g |
| Diethylene glycol butyl ether | 0.59 g |
| Half-second nitrocellulose solution | 6.71 g |
| 150-second nitrocellulose solution | 0.48 g |
| Butylated amino resin CCR 764 | 0.59 g |

Solution Q was made up by addition of the ingredients in the order as shown and thoroughly mixed together.

| Solution R | |
|---|---|
| Silcolease crosslinker 92A | 0.0376 g |
| Silcolease 7420 | 3.642 g |
| VM&P Naphtha | 8.97 g |
| Toluene | 2.56 g |
| Isopar H | 0.63 g |

Solution Q was poured into solution R while stirring thoroughly. The mixture was stirred for 15 minutes and then 0.149 g of the Silcolease Catalyst 90B was added.

The solution was then bar coated onto 175-micron polyester to a wet coating thickness of 80 microns and air dried for 0.5 minute followed by curing at 140° C. during 5 minutes. The dry weight was 4.39 g.s.m.

The finished polyester-based printing plate was then imaged on a Lotem 400 at an energy intensity of 200 mW. Imaged areas were ablated by the heat generated by the absorption of laser energy by the IR dye in the coating.

The plate was mounted on a Heidelberg GTO printing press and used with waterless printing ink. It ran 25,000 impressions and good quality printing results were obtained throughout the run.

EXAMPLE IX

This set of examples may be compared with Example IV. It demonstrates the variation in suitability of aminoplasts for use in the system. In the present example, the butylated melamine formaldehyde resin (CCR 764) of Example IV was exchanged for different kinds of amino-resins.

Solutions were made up by addition of the same concentration (dry %) of different resins to the same amount of non-silicone part of the material excluding resin CCR 764.

These solutions were each added to the same amount of the silicone solution, mixing together for about 15 minutes and then adding the same amount of the Catalyst OL.

The solutions were than bar coated onto 175-micron polyester to a wet coating thickness of 80 microns and air dried for 2.5 minutes followed by 1.5 minutes, up to a temperature of 140° C. and then held at that temperature for 5 minutes. The dry weight was 3.95-3.99 g.s.m.

| Solution S (non-silicone part not including cross-linking resin) | |
|---|---|
| IR dye solution (as in Example IV) | 39.79 g |
| Diethylene glycol butyl ether | 1.28 g |
| Half second nitrocellulose solution | 6.28 g |
| 150 second nitrocellulose solution | 0.96 g |

| Solution T (silicone part) | |
|---|---|
| Crosslinker V24 | 0.0615 g |
| Dehesive 944 | 7.284 g |
| Isopar H | 1.25 g |
| VM&P Naphtha | 23.03 g |

EXAMPLE IX-1

| | |
|---|---|
| Solution S | 12.09 g |
| Cymel MB-98 | 0.167 g |
| Solution T | 7.9 g |
| Catalyst OL | 0.064 g |

Cymel MB-98 (97+_2% solids) is a butylated melamine-formaldehyde crosslinking resin with a high degree of alkylation, low methylol content and low imino functionality. Coating was not cured completely.

EXAMPLE IX-2

| | |
|---|---|
| Solution S | 12.09 g |
| CCR 770 | 0.264 g |
| Solution T | 7.9 g |
| Catalyst OL | 0.065 g |

CCR 770 (61% solids) is a highly reactive isobutylated melamine formaldehyde cross-linking resin with a medium degree of alkylation, low methylol content and medium imino functionality. Coating was not cured properly.

EXAMPLE IX-3

| | |
|---|---|
| Solution S | 12.09 g |
| Cymel UM-15 | 0.18 g |

Cymel UM-15 (98% non volatile) is a methylated urea-formaldehyde crosslinking resin with a medium to high degree of alkylation, a medium methylol content and low imino functionality. The resin Cymel UM-15 was incompatible with Solution S.

EXAMPLE IX-4

| | |
|---|---|
| Solution S | 12.09 g |
| Cymel UFR 60 | 0.186 g |

Cymel UFR 60 (88% in isopropanol) is a methylated urea formaldehyde crosslinking resin with a medium degree of alkylation, high methylol content and low imino functionality. The resin Cymel UFR 60 was incompatible with Solution S.

EXAMPLE IX-5

| | |
|---|---|
| Solution S | 12.09 g |
| Cymel U 80 | 0.17 g |
| Solution T | 7.91 g |
| Catalyst OL | 0.062 g |

Cymel U-80 (96% non-volatile) is a highly butylated urea formaldehyde resin.

After imaging as in previous examples, post-imaging cleaning removed imaged materials together with surrounding areas, giving evidence of insufficient curing.

EXAMPLE IX-6

| | |
|---|---|
| Solution S | 12.09 g |
| Cymel UI-19-IE | 0.268 g |
| Solution T | 7.91 g |

Cymel UI-19-IE (60% in isobutanol/ethanol) is an isobutylated urea-formaldehyde crosslinking resin with a medium degree of alkylation, medium methylol content and low imino functionality. The resin shows incompatibility, manifesting itself as phase separation in the vessel.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

SOURCES OF RAW MATERIALS a. NK 6271, NK 5646, NK 6270, NK 4489, NK 4680, NK 5042, NK 2911—Infrared absorption cyanine dyes. HAYASHIBARA BIOCHEMICAL LABORATORIES, INC. Kankoh Shisiko Institute, Okayama, Japan.

b. S 0325, S 0229, S 0260, S 0712—Cyanine dyes. FEW Chemicals GmhH. Wolfen, Germany c. Ccr 764, CCR 770 is a trade mark of resins of CARMEL RESINS Ltd. Atlit. Israel.

d. Dehesive 944 (addition crosslinking silicone) with Catalyst OL and Crosslinking agent V24. Wacker-Chemie GmbH. Munchen, Germany e. Cymel UM-15, Cymel MB-98, Cymel UFR 60, Cymel U-80, Cymel UI-19-IE. is a trade mark of resin crosslinking agents as well as Cycat 4040 and Cycat 4045 is a trade name of catalysts of Cytec Industries Inc., West Paterson, N.J., USA f. Silcolease 7420 (polyaddition curing silicone) with Silcolease organometallic catalyst 90B and Silcolease Crosslinker 92A. RHODIA SILICONES Europe, Lyon, Franc g. SDA 8080, SDA 4927, SDB 6592, SDB 7047—Near Infrared absorption dyes. H.W.SANDS CORP. Jupiter h. Epolight 3063—Near Infrared dye. EPOLIN, INC. Newark i. ADS 827MT, ADS 830A., ADS 790NH—Near Infrared dyes. American Dye Source, Inc. Quebec, Canada j. Isopar H. Isoparaffin solvent ExxonMobil Chemical Europe Belgium k. VM&P Naphtha—Aliphatic solvent naphtha (Petroleum). Vopak USA Inc. Kirkland, Wash., USA l. Klucel GF Pharm—Hydroxypropylcellulose. Hercules Incorporated. Wilmington m. GPRI 7590 bakelite phenolic resin Georgia-Pacific Corporation Atlanta, USA Lotem 400—thermal platesetter CREO IL Ltd. Herzliya B, Israel Karat 74 is a digital offset printing press KBA, Germany

The invention claimed is:

1. A lithographic printing plate comprising: a substrate; and an infrared-imageable, self-organized layer featuring a continuous varying distribution in a direction vertical to the substrate of a hydrophilic/oleophilic, ink-receptive polymer material and a hydrophobic/oleophobic ink-repelling polymer material, the distribution being induced by the incompatibility of said materials.

2. A lithographic printing plate according to claim 1, wherein the substrate is aluminum or polyester.

3. A lithographic printing plate according to claim 2, wherein the substrate is aluminum that is grained and anodised, or the substrate is aluminum that has been treated with phosphoric acid.

4. The lithographic printing plate of claim 2, wherein the substrate is aluminum that is pre-coated with a thermally insulating organic coating.

5. The lithographic printing plate of claim 1, wherein the self-organized layer contains a polydimethylsiloxane, a hydrophilic polymer, and an infrared absorbing dye, pigment, or a mixture of dyes and pigments.

6. The lithographic printing plate of claim 1, wherein said hydrophobic/oleophobic ink-repelling polymer material comprises a silicone polymer and said hydrophilic/oleophilic, ink-receptive polymer material comprises a non-silicone polymer.

7. The lithographic printing plate of claim 6, wherein the non-silicone polymer is nitrocellulose or a mixture of nitrocelluloses.

8. The lithographic printing plate of claim 6, which on selective imaging by infra-red ablation gives oleophilic image areas formed by the surface of the substrate, and oleophobic non-image areas formed from unablated silicone.

9. The lithographic printing plate of claim 6, which on selective imaging by infra-red ablation gives oleophilic image areas formed by the non-silicone polymer-enriched surface directly attached to the substrate exposed by the image ablation process and oleophobic non-imaged areas formed from unablated silicone.

10. The lithographic printing plate of claim 6, which on selective ablation by infra-red radiation gives hydrophilic ablated (background) areas formed by the surface of the substrate, and oleophilic non-ablated (image) areas formed from unablated silicone.

11. The lithographic printing plate of claim 6, which on selective ablation by infra-red radiation gives hydrophilic ablated (background) areas formed by the non-silicone polymer-enriched surface directly attached to the substrate exposed by the ablation process and oleophilic non-ablated (image) areas formed from unablated silicone.

12. A method of forming a lithographic printing plate, comprising providing a substrate, and forming on said substrate, an infrared-imageable, self-organizing layer that features a continuous varying distribution in a direction vertical to the substrate of a hydrophilic/oleophilic, ink-receptive polymer material and a hydrophobic/oleophobic ink-repelling polymer material that are dissolved in a mixture of at least two volatile organic solvents, the distribution being induced by the incompatibility of said materials during the evaporation of said mixture of at least two volatile organic solvents.

13. The method of claim 12, wherein the substrate is aluminum or the substrate is polyester.

14. The method of claim 13, wherein the substrate is aluminum that is grained and anodised or the substrate is aluminum that has been treated with phosphoric acid.

15. The method of claim 12, wherein the substrate is aluminum and the method additionally comprises the step of pre-coating the aluminum with a thermally insulating organic coating.

16. The method of claim 12, wherein the self-organized layer contains a polydimethylsiloxane, a hydrophilic polymer, and an infrared absorbing dye, pigment, or a mixture of dyes and pigments.

17. The method of claim 12, wherein said hydrophobic/oleophobic ink-repelling polymer material comprises a silicone polymer and said hydrophilic/oleophilic, ink-receptive polymer material comprises a non-silicone polymer.

18. The method of claim 17, wherein the non-silicone polymer is nitrocellulose or a mixture of nitrocelluloses.

19. The method of claim 12, wherein said self-organizing layer contains a poly dimethyl siloxane, said poly dimethyl siloxane soluble in at least one of said mixture solvents.

20. The method of claim 19, wherein said hydrophilic/oleophilic, ink-receptive polymer material comprises a non-silicone polymer that is soluble in at least one of said mixture solvents.

21. The method of claim 19, wherein the ingredients of said self-organizing layer are diluted in a solvent mixture selected to permit all of the ingredients to remain in solution for at least 8 hours prior to application to said substrate.

22. The method of claim 12, wherein the self-organizing layer contains a poly dimethyl siloxane and an infra-red absorbing dye or mixture of dyes that are chosen so that they do not inhibit the curing of the poly dimethyl siloxane.

23. The method of claim 12, additionally comprising the step of heating said applied self-organizing layer, wherein the layer organizes itself into an infinite number of horizontal layers constituting a self-organized system.

24. The method of claim 17, additionally comprising the step of heating said applied self-organizing layer, wherein the layer organizes itself into an infinite number of horizontal layers constituting a self-organized system having a mixture rich in poly methyl siloxane on its surface and a mixture rich in non-silicone polymer in proximity to the substrate surface.

* * * * *